June 3, 1969 R. C. GALLAGHER ET AL 3,448,353

MOS FIELD EFFECT TRANSISTOR HALL EFFECT DEVICES

Filed Nov. 14, 1966 Sheet 1 of 2

WITNESSES:

Bernard R. Gigue

James F. Young

INVENTORS
Robert C. Gallagher &
William S. Corak.
BY Gordon H. Telfer
ATTORNEY

United States Patent Office 3,448,353

Patented June 3, 1969

3,448,353

MOS FIELD EFFECT TRANSISTOR HALL EFFECT DEVICES

Robert C. Gallagher, Baltimore, and William S. Corak, Arnold, Md., assignors to Westinghouse Electric Corporation, Pittsburgh, Pa., a corporation of Pennsylvania Filed Nov. 14, 1966, Ser. No. 593,806
Int. Cl. H01l 3/00, 9/00
U.S. Cl. 317—235 7 Claims

ABSTRACT OF THE DISCLOSURE

The inversion layer in MOS-FET's is utilized to get appreciable Hall effect voltage in a structure that may be incorporated in integrated circuits. Structurally, the devices are similar to conventional MOS type devices with, however, additional contact areas transverse to the source to drain current path for deriving the Hall effect voltage and, preferably, a source to drain length to width ratio within the range from about 2.5 to about 3.5.

This application is directed to semiconductor devices of the MOS type and particularly to such devices suitable for use as Hall effect elements.

The Hall effect occurs generally in electrically conductive materials. Briefly, a current flowing at right angles to a magnetic field generates an electric field, and hence a voltage, in a direction at right angles to both the current and magnetic field. Semiconductor materials such as silicon, indium antimonide and indium arsenide are known to exhibit the Hall effect. Silicon, which is widely used in conventional semiconductor devices is not normally considered practical for Hall effect elements because it has relatively low carrier mobility; a thick cross-section required for convenient fabrication and handling minimizes the Hall voltage. A Hall element in bulk silicon could not readily be isolated from other components in an integrated circuit. Similar considerations apply to bulk Hall effect elements of other semiconductor materials. However other semiconductor materials, such as III–V materials, are more attractive at least from the standpoint that higher carrier mobilities are available although fabrication technology is not as advanced as in the case of silicon.

It is an object of this invention to provide improved semiconductor Hall effect devices.

Another object of this invention is to provide Hall effect devices that may be fabricated by techniques presently employed in the fabrication of existing semiconductor devices and integrated circuits.

Another object is to provide a Hall effect device that may be incorporated within a semiconductor integrated circuit with effective internal isolation from other elements.

Another object is to provide improved Hall effect elements in semiconductor material, including silicon, without requiring thick effective cross-sections that reduce the Hall voltage.

The invention, briefly, achieves the above-mentioned and additional objects and advantages through the utilization of an MOS type of field effect transistor structure as a Hall device. Voltage sensing means such as a pair of regions contacting the inversion layer disposed in a direction transverse to the source to drain current are provided to detect the Hall voltage. The device is generally useful in the manner of Hall effect devices and further may be incorporated by existing semiconductor device technology in single devices or in integrated circuits.

The invention will be better understood by referring to the following description taken with the accompanying drawing wherein.

The invention is generally applicable to all types of metal-insulating layer-semiconductor field effect transistors whether the insulating layer be an oxide layer, such as silicon dioxide, as is usually the case, or some other insulating layer such as silicon nitride or other refractory oxides and nitrides whether compounds of the semiconductor material or not. For convenience, however, the expression MOS device, or the like, as used herein is meant to encompass all such metal-insulating layer-semiconductor devices.

The invention applies to all of the MOS device types including both n-channel and p-channel type transistors and also depletion mode and enhancement mode type transistors as are known in the art. In all of these devices an inversion layer is made to occur, either because of the manner of fabrication or manner of operation, in the surface of a semiconductor region to provide a conductive path between source and drain regions of opposite type to the bulk material. Signals applied to a gate electrode over an insulating layer covering the inversion layer between the source and drain regions, the channel region, modulates the conductivity of the channel. When disposed in a magnetic field with a component normal to the source-drain current path a transverse Hall voltage is generated that may be detected by any of the various means such as providing regions like the source and drain regions with contacts thereto for connection to sensing or utilization devices.

Figure 1:
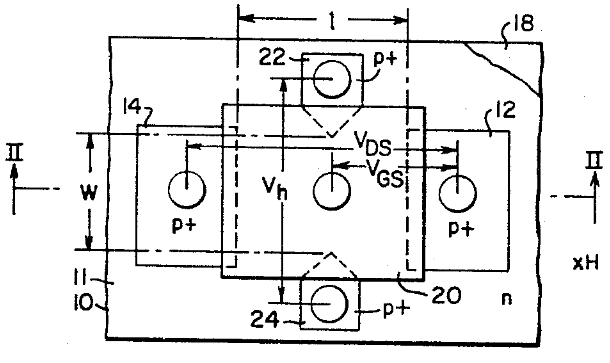
FIGURE 1 is a partial plan view of a device in accordance with the present invention.
Figure 2:
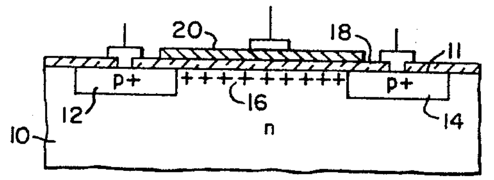
FIG. 2 is a cross-sectional view of the device of FIG. 1 taken along the line II—II.

Referring now to FIGS. 1 and 2, there is shown a device in accordance with this invention comprising a unitary body of semiconductive material that includes a first region 10 of a first type of conductivity, here n-type, in a first surface 11 of which are disposed second and third regions 12 and 14 of a second type of conductivity, here p-type, to provide the source and drain regions, respectively. The source and drain regions 12 and 14 are relatively highly doped compared with the bulk material 10 and hence are indicated as p+ regions in the drawing.

At least over a portion 16 of the first region 10 between the source and drain regions 12 and 14 is disposed a layer 18 of insulating material (shown broken away in FIG. 1) on which is positioned a gate electrode 20. Transverse to the path between the source and drain regions 12 and 14 are two additional regions 22 and 24 of the same type and doping for detection of the Hall voltage. The source and drain regions 12 and 14 and the two Hall effect regions 22 and 24 should be mutually interconnected by the inversion layer occurring in the channel 16 under the insulating layer 18 either by reason of the natural effect of the insulating layer, that is, where it has sufficient electrostatic charge to induce an inversion layer, or by application of the suitable potential to the gate electrode 20. In any event there is provided means for establishing and modulating an inversion layer in the surface under the insulating layer 18 between the regions 12, 14, 22 and 24. This may possibly be achieved through the use of electron beam, or other particle bombardment, or optical bombardment as well as that shown by way of example. The two Hall effect regions 22 and 24 provide a means for sensing any electric field generated in the inversion layer transverse to a straight path between the source and drain regions.

In this example, the inversion layer occurs upon the application of a suitable potential to the gate electrode 20 and hence the gate electrode 20 should overlap to some extent both the source and drain regions 12 and 14 and the two Hall effect regions 22 and 24. This structure permits enhancement mode operation and may be employed also in devices that exhibit depletion mode operation.

An expression for the approximate value of a Hall voltage is:

$$V_h = \mu\rho^{1/2}(w/tl)^{1/2}B$$

where:

$\mu$=the carrier mobility
$\rho$=the resistivity of the conductive material
$w$=the width of the current path
$l$=tht length of the current path
$t$=the thickness of the current path
B=the magnetic field intensity Since the effect relied on in devices in accordance with this invention occurs in the inversion layer rather than the bulk material the thickness may be greatly minimized and relative freedom in the selection of the width to length ratio can be provided.

Devices may if desired be fabricated on high resistivity silicon with length to width ratios of 3 or greater and extremely small values of thickness, typically less than 1 micron. Thus the factor $(w/tl)^{1/2}$ may be an order of magnitude larger than for commercially available units of bulk semiconductive material. As discussed hereinafter, experimental results show the above formula to be inaccurate as to indicating desirable length to width ratios because of the peculiar nature of the inversion layer as opposed to bulk material. However, the advantage of the small thickness of the inversion layer is clear.

Devices in accordance with this invention may be applied and used in the manner of previous Hall effect devices such as for measurement of magnetic field intensity.

A number of experimental devices have been made and successfully operated embodying the features described in connection with FIGS. 1 and 2. A report of the operation achieved with these devices appears in an article in Solid State Electronics, volume 9, pages 571 to 580, Pergamon Press, May 1966, which should be referred to for a fuller description of such devices and their operation.

In brief summary, the devices made included a substrate of n-type single crystal silicon material having a resistivity of about 5 ohm-cm. These devices were made from wafers of grown material although they may also be made in epitaxial layers grown on a substrate of different conductivity type or resistivity. The source and drain and Hall voltage regions are selectively diffused using conventional oxide masking and photolithographic techniques with a p-type dopant to a surfact concentration of about $10^{19}$–$10^{20}$ atoms/cm.$^3$ and a thickness of about 3 microns.

The insulating layer over the channel was a thermally grown silicon dioxide formed at about 1000° C. in a dry oxygen atmosphere to a thickness of about 1000 A. This material is formed after the diffusion mask oxide is removed from the channel region. Contact to the various regions is formed by vacuum evaporation of aluminum to a thickness of about 8000 A. over the whole device and selectively etching away that aluminum not required. Leads are applied to the aluminum by thermal compression bonding of gold wire. In such a device the application of a sufficient negative voltage to the gate creates a p-type channel. Devices of various length to width ratios were fabricated. For example, devices with channel widths of 0.020 inch were made with different channel lengths from 0.100 to 0.005 inch.

Figure 3:
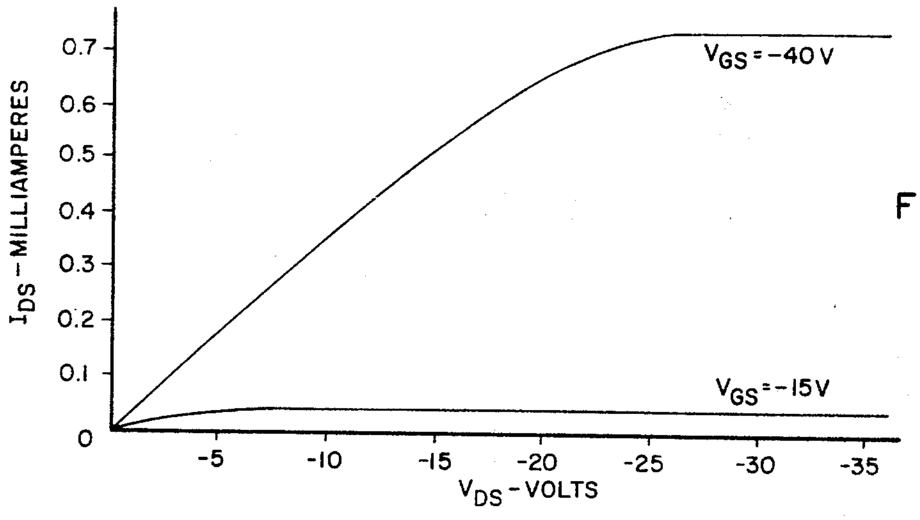
FIGS. 3, 4, 5 and 6 are curves showing the performance of typical devices in accordance with this invention.
Figure 4:
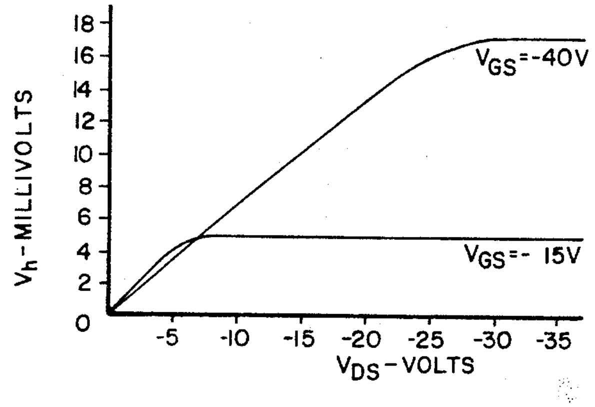

FIG. 3 illustrates variation in source to drain current, $I_{DS}$, with respect to drain to source voltage, $V_{DS}$, for two different values of gate to source voltage, $V_{GS}$. This data is typical for MOS field effect transistors. In this instance the length to width ratio was about 5 and the measurements were made at 300° K. In FIG. 4 the Hall voltage, $V_h$, for the same device, in a magnetic field of 2000 gauss, is similarly plotted against the drain to source voltage, $V_{DS}$, illustrating generally that the same shape of curve is obtained at a given gate to source voltage with however differences near the origin because of the fact that the inversion layer increases in thickness with increasing gate voltage and tends to minimize the Hall voltage. That is, the Hall voltage varies directly with drain current and inversely with thickness while the drain current itself tends to increase with increasing thickness.

Figure 5:
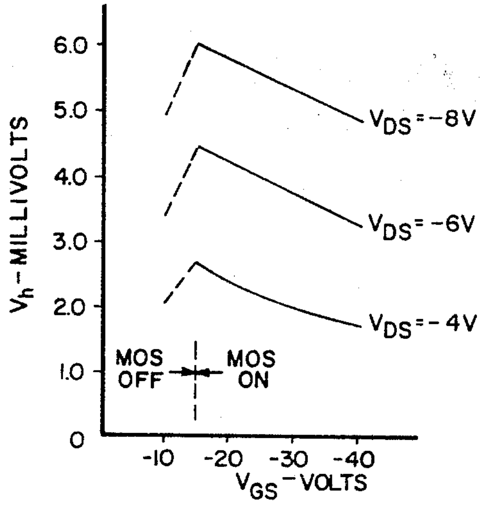

FIG. 5 illustrates the variation of Hall voltage with gate to source voltage, in a magnetic field of 2000 gauss, exhibiting the maximum in Hall voltage that occurs at the turn-on gate voltage, that is, the minimum gate voltage at which the conductive inversion layer between the source and drain regions is formed.

Figure 6:
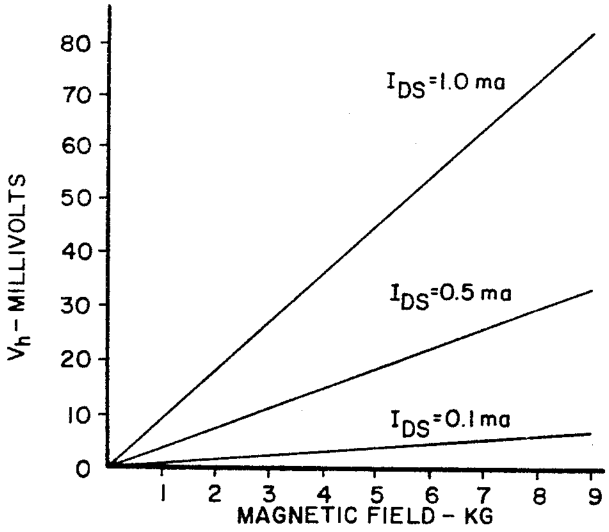

FIG. 6 illustrates variation in Hall voltage with magnetic field at 300° K. for a p-type inversion layer device as described with a length to width ratio of 3 and a gate to source voltage of −45 volts. As is reported in the aforementioned article (evidenced by FIG. 10 therein), an optimized Hall element in accordance with this invention will have a length-to-width ratio of about 3 (say from about 2.5 to about 3.5) because length to width ratios above that figure do not improve the Hall voltage but only add junction capacitance and reduce the frequency response. It is also desirable in order to maximize the transconductance of the MOS transistor to minimize the length-to-width ratio.

One use for which devices in accordance with this invention are particularly suitable is as linear voltage attenuators. The curve of FIG. 4 illustrates various possibilities of applying information in the form of drain to source voltage, gate voltage or magnetic field strength hereunder DC conditions or as AC signals. The drain to source voltage may be applied at frequtncies up to about 100 megahertz while the gate voltage may be applied at frequencies up to about 10 megahertz. An alternating magnetic field may be used as well as a permanent magnet. Thus there can be achieved multiplication or signal mixing by selectively applying signals to the device.

Another effect inherent in the devices of this invention is that they exhibit an inductive effect because the Hall voltage may be fed back out of phase with the current producing it, the drain to source current. This effect is similar to that occurring in bulk field effect elements but the devices in accordance with this invention provide greater utility because they can be incorporated in semiconductor integrated circuits with isolation from other elements.

A structural modification may be provided so that the magnetic field applied to the Hall element is representative of an electrical characteristic of an electrically isolated circuit. For example, a conductor carrying a current that passes near the Hall element will influence it by reason of the magnetic field that it inherently produces. For maximum magnetic coupling the conductor should of course be closely spaced near the Hall element. This may be achieved by disposing an insulating layer over the gate electrode and positioning the current carrying conductor on that. This is particularly attractive for forming integrated circuits where the Hall effect element may be provided in an isolated pocket of material and only magnetically coupled to other elements in the circuit.

While the invention has been shown and described in a few forms only, it will be apparent that various changes and modifications may be made without departing from the spirit and scope thereof.

What is claimed is:

1. A Hall effect device comprising: a unitary body of semiconductive material including a first region of a first type of conductivity, said first region having a surface; spaced second and third regions of a second type of conductivity disposed in said surface; a layer of insulating material disposed on said surface at least between said second and third regions; means for establishing an inversion layer in said surface under said insulating layer and for modulating current flow between said second and third regions; and means for deriving a Hall effect voltage between spaced points in said inversion layer on opposite sides of a straight line segment between said second and third regions.

2. The subject matter of claim 1 wherein: said means for establishing an inversion layer and for modulating current flow includes a conductive gate electrode on said insulating layer between said second and third regions; said means for deriving voltage includes spaced fourth and fifth regions of said second type of conductivity disposed in said surface at said spaced points.

3. The subject matter of claim 2 wherein: said gate electrode overlaps a portion of each of said second, third, fourth and fifth regions.

4. The subject matter of claim 2 further comprising: a conductive contact to each of said second, third, fourth and fifth regions; first potential supply means connected across said contacts to said second and third regions to develop a source to drain current through said inversion layer; second potential supply means connected to said gate electrode; voltage utilization means connected to said contacts to said fourth and fifth electrodes; means for applying a magnetic field to said inversion layer having a component normal to said surface.

5. An MOS-type transistor suitable for use as a Hall effect device comprising: a first region of a first type of conductivity, said first region having a surface; second, third, fourth and fifth regions of a second type of conductivity disposed in said surface, said fourth and fifth regions being disposed in a line transverse to a straight line segment between said second and third regions; a layer of insulating material disposed on said surface at least between said second, third, fourth and fifth regions; a conductive gate electrode on said insulating layer between said second, third, fourth and fifth regions; a contact on each of said second, third, fourth and fifth regions.

6. The subject matter of claim 5 wherein: said gate electrode overlaps a portion of each of said second, third, fourth and fifth regions.

7. The subject matter of any one of claims 2, 3, 5, and 6 wherein: the length to width ratio of the rectangular area defined by said second, third, fourth and fifth regions is within the range from about 2.5 to about 3.5.

References Cited

UNITED STATES PATENTS

| | | | |
|---|---|---|---|
| 2,714,182 | 7/1955 | Hewitt | 317—234 |
| 2,804,581 | 8/1957 | Lichtgarn | 317—235 |
| 3,102,230 | 8/1963 | Kahng | 323—94 |
| 3,263,095 | 7/1966 | Fang | 307—88.5 |
| 3,321,680 | 5/1967 | Arndt et al. | 317—234 |

JAMES D. KALLAM, *Primary Examiner.*

U.S. Cl. X.R

148—33; 317—234